United States Patent [19]

Johnston et al.

[11] 4,197,582

[45] Apr. 8, 1980

[54] AUXILIARY POWER SUPPLY AND TIMER ARRANGEMENT FOR TIME REGISTERING MULTIFUNCTIONAL ELECTRIC ENERGY METERS

[75] Inventors: Paul M. Johnston; Albert H. Maxwell, Jr., both of Raleigh, N.C.; Clyde A. Booker, Jr., Pittsburgh, Pa.

[73] Assignee: Westinghouse Electric Corp., Pittsburgh, Pa.

[21] Appl. No.: 891,996

[22] Filed: Mar. 31, 1978

[51] Int. Cl.² ............... G06F 15/20; G01R 11/57; G01R 21/06
[52] U.S. Cl. .................. 364/483; 324/116; 324/142
[58] Field of Search ............ 364/483, 492; 324/76 R, 324/103 R, 113–116, 142

[56] References Cited

U.S. PATENT DOCUMENTS

| | | | |
|---|---|---|---|
| 3,747,068 | 7/1973 | Bruner et al. | 364/483 X |
| 3,937,890 | 2/1976 | Blethen et al. | 179/2 A |
| 4,050,020 | 9/1977 | Germer et al. | 324/116 |
| 4,065,676 | 12/1977 | Elias | 307/66 |
| 4,077,061 | 2/1978 | Johnston et al. | 364/483 |

Primary Examiner—Jerry Smith
Attorney, Agent, or Firm—R. W. Smith

[57] ABSTRACT

A time based measuring system for electric energy meters includes a non-volatile data memory for processing time related data. The system further includes a main DC supply energized from an AC source and an auxiliary DC supply energized by a primary battery source. The data memory and a low power secondary timer circuit are energized from the auxiliary DC supply in response to failure of the main DC supply. A low power circuit arrangement including the secondary circuit continues current time and calendar registrations during a power outage.

24 Claims, 5 Drawing Figures

AUXILIARY POWER SUPPLY AND TIMER ARRANGEMENT FOR TIME REGISTERING MULTIFUNCTIONAL ELECTRIC ENERGY METERS

BACKGROUND OF THE INVENTION

1. Field of the Invention

This invention relates to an auxiliary power supply and timer arrangement for AC electric energy meters including a programmable time based measuring system for performing multiple metering operations and relating such operations to real time, and further to such an alternate arrangement including a secondary timer circuit and an auxiliary DC supply having a non-rechargeable battery capable of maintaining a real time record and non-volatile metering data during power outage interruptions reoccurring over the extended and unattended service life of the meter.

2. Description of the Prior Art:

Electric energy billing meters of the electromechanical type are well known for their extensive use at the premises of separate users of electric energy. The meters establish the amount of electric energy consumption for billing by the electric energy supplier. Most universally used billing meters provide for measuring the total consumption of electric energy or a maximum peak demand which requires a manual resetting operation, typically once each month. Increased flexibility in measuring different parameters such as measuring both kilowatt hour consumption and kilowatt demand at different rates, is often desired. Also desired is to separately totalize the different measured parameters as they are measured during different designated time intervals during each day. This method of metering is known as time-of-day metering by those skilled in the art. The designated time-of-day intervals typically correspond to tohose times at which the levels of demand for energy from an energy supplier, such as an electric utility, is at a highest, or intermediate, or low level.

Induction watthour meters equipped with mechanical multi-dual kilowatt hour registers or combined kilowatt hour and watt demand registers are known and selective operation of separate sets of register dials are known to be provided in response to mechanical time switch mechanisms. The aforementioned registers and mechanical time mechanisms have only a few different measuring capabilities and are often limited as to the different time intervals which may be provided and such intervals are generally not variable as between weekdays and weekend days. In U.S. Pat. No. 4,077,061 for a Digital Processing And Calculating AC Electric Energy Metering System, issued Feb. 28, 1978, and assigned to the assignee of this invention a programmable electronic calculating circuit is disclosed for providing large flexibility in measuring several different parameters of an electric energy quantity. The measured parameters are quantized and recorded values thereof are non-volatively magnetically recorded with respect to time interval indications. The circuit does not develop an independent record of real time or accummulate a separate record of the different parameters when measured during different preselected daily time periods. There is disclosed a means of detecting interruption of an AC energized DC supply and for temporarily supplying a system after such a power interruption. No auxiliary DC supply is required for a random access data memory portion of the system which is capable of being reprogrammed from a read only memory in the system. A magnetic tape recorder for use with the aforementioned system does have a battery carryover circuit arrangement which may be as described in U.S. Pat. No. 3,538,406 issued Nov. 3, 1970, and assigned to the assignee of this invention.

In other electrical energy measuring systems where electronic times are utilized to generate current time for time-of-day data, the data is usually accumulated and stored in a non-volatile memory circuit requiring an uninterrupted supply of DC power. In the aforementioned systems, a source of time based signals are produced and totalized to represent each second, minute, hour and day of the week, for example. The systems may be preprogrammed to respond to different time intervals such as the same or different time periods each day, to totalize a given measured parameter of the electric energy quantity being measured. The measured parameters are separately related to a designated time interval each day. Kilowatthour consumption may be separately measured and totalized during designated high or on-peak time intervals, intermediate peak intervals or low or off peak time intervals. For such systems supplied by an AC energized DC supply, a failure of the AC source can cause loss of the stored time of day data in a volatile electronic memory. Interruptions in the operation of a time based signal generator will also occur. Where large numbers of meters having such electric energy measuring systems, it is impractical to go to each meter and update them to the current time. Alternate or standby DC supply circuits are required to maintain the systems operational for continuing to register current time and to retain the stored time data which has been accumulated up to the time of the power failure. U.S. Pat. No. 4,050,020 issued Sept. 20, 1977 discloses an electrical energy measuring system for measuring different preselected kilowatthour consumption periods each day. An auxiliary battery backup supply utilizes a rechargeable battery. The central control circuit thereof is battery energized to also energize an oscillator time base generator to continue real time recording during an outage of the main supply.

In U.S. Pat. No. 4,065,676 a battery backup system is disclosed utilizing a rechargeable battery for uninterrupted supply of DC voltage. No time-of-day recording is described in the last-named patent. In U.S. Pat. No. 3,937,890 a secondary power supply is disclosed to retain pulse counts accumulated in a volatile counter in an electric utility metering system upon failure of a main AC energized DC supply.

Accordingly, an improved auxiliary DC supply and secondary timer arrangement is desired for time registering electric energy metering system in which time-of-day data and electronic memory data is to be preserved when the main DC supply fails. Further desired is an auxiliary DC supply for such arrangements including a standby battery which is operable at a minimum current drain so that the battery does not have to be replaced or serviced in a meter including the system and having in-service times which may be in the order of several years and subject to widely varying operating conditions. A further desirable feature is to have a stand-by battery source that is capable of operating in ambient temperature extremes typically experienced by electric energy meters presently being used. The present invention is directed to achieve the above considerations in an economical and reliable manner.

BRIEF DESCRIPTION OF THE INVENTION

A time registering multi-function electric energy meter includes a programmable time based measuring system having a non-volatile random access data memory circuit arrangement and both primary and secondary timer circuits. A main DC supply and the primary timer circuit are energized from an AC electric energy quantity to be measured by the meter. A metering sequence logic control circuit uses externally alterable time catagories in the data memory circuit to accumulate different measured parameters of electric energy usage in different time of usage categories. The control circuit processes first time base signals from the primary timer circuit to store current time data corresponding to time-of-day in minutes, hours and day of the week. Upon an outage of the electric energy quantity being detected, the main DC supply is deenergized as concurrently the energy quantity is incapable of being measured. The control circuit receives a power fail signal upon activation of an auxiliary DC supply before it is deenergized. The auxiliary DC supply includes a non-rechargeable or primary standby battery source which is activated for supplying the secondary timer and the data memory. The secondary timer circuit includes a crystal controlled oscillator which is activated to generate second time base signals which are used to continue real time measurement and recording during a power outage of the measured electric energy.

In one preferred embodiment of the invention, the secondary timer circuit includes the oscillator with an associated divider output circuit and a five decade counter memory all energized from the auxiliary DC supply. After the start of a power outage, the oscillator circuit output signal produces the second time base signals at a repetition rate corresponding to a preselected number of seconds, for example every eight seconds. The counter memory receives the eight second time base signals and continues to accumulate a count of the signals until the end of the outage. The logic control circuit is reenergized at the end of the outage and stops the oscillator output producing the second time base signals and holds the total count of these signals in counter memory circuit. Thereafter, the outputs of the counter memory are processed by the control circuit to add the time interval of the outage, as represented by the counter memory output and multiplied by a factor of eight seconds, and then added to the start of the power outage time data in the data memory. Accordingly, at the end of the outage time, the measuring system is conditioned for again measuring different desired parameters of the electric energy quantity in a current time-of-delay related fashion.

In another preferred embodiment of the present invention, the secondary timer circuit includes the oscillator with a divider output to produce, during a power outage, second time base signals at another preselected rate, for example, every four seconds. Upon the start of a power outage, the auxiliary power supply energizes the data memory to continue its non-volatile condition, energizes the secondary timer circuit, and also energizes an intermittent power switching or power pulsing circuit controlled by the second time base signals. The logic control circuit is conditioned to receive power momentarily at each pulse signal of the second time base signals. The control circuit is turned on only momentarily but sufficiently to update the current time data in the non-volatile data memory and to reset the oscillator and then turn off. Accordingly, the logic control circuit is turned on for a near negligible short time duration during the four seconds interval between the second time signals to maintain standby battery current drain to a minimum. The end of the outage re-establishes the main DC supply for supplying the measuring system. The system is then conditioned to measure the different desired parameters of the electric energy quantity in a real time of usage relate manner. Accordingly, the auxiliary power supply and timer arrangements of this invention have a minimum of circuit components optimumly arranged to provide minimum power drain from a standby primary battery source. Carry-over and maintenance of accurate current time registration is provided for the time registering multifunction electric energy meter such that the more reliable and more temperature insensitive characteristics of a primary standby battery may be used for long unattended meter service.

Other advantages and features of the present invention will be apparent from the detailed description of the drawings briefly described hereinafter.

DETAIL DESCRIPTION OF THE PREFERRED EMBODIMENTS

Figure 1:
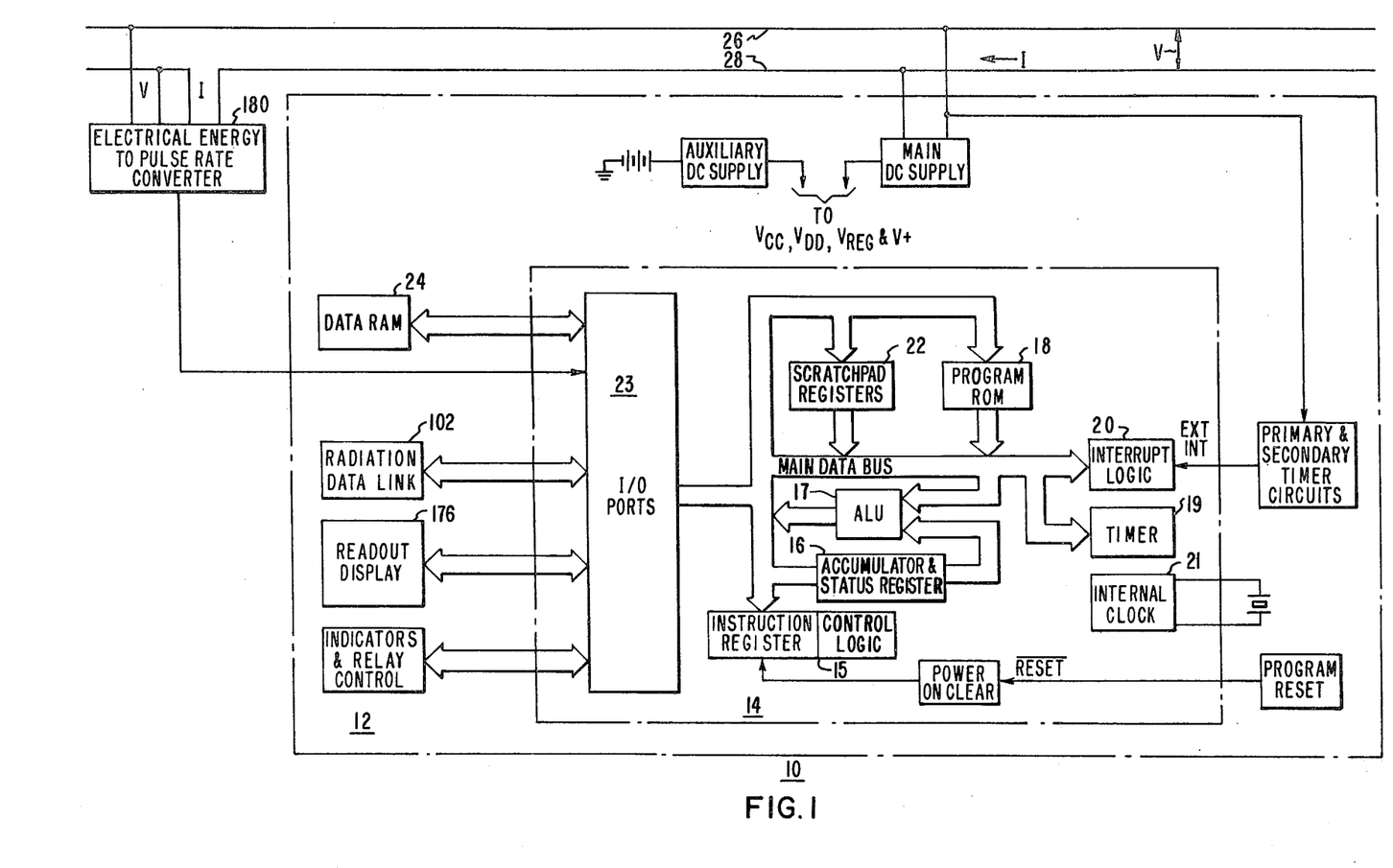
FIG. 1 illustrates an electrical block diagram of one embodiment of a time registering multifunction electric energy meter including a metering sequence logic control circuit and an auxiliary power supply and timer arrangement made in accordance with the present invention.

Referring now to the drawings wherein like numerals are used to identify the same or identical elements or circuits, and more particularly to FIG. 1 there is shown a time registering multifunction AC electric energy meter 10 including a programmable time based measuring system 12. A metering sequence logic control circuit 14 is included in the system 12 and is formed by an F8 microcontroller such as the type MK 3870 available from Mostek Corp. and described in the publication entitled: F8 Microprocessor Devices, Single-Chip Microcomputer MK 3870, available from the aforementioned Mostek Corp., Carroltown, Tex. 75006. As described in the aforementioned publication, the logic control circuit 14 provides multifunction logic operations and generally includes the following subsystems: A control logic and instruction register 15, an accumulator and status register 16, an arithmetic and logic unit (ALU) 17, a program read only memory (ROM) 18, a timer 19 and interrupt logic 20 and an internal clock 21.

The logic control circuit 14 further includes scratch-pad registers 22 providing general purpose internal RAM memory. Input/output (I/O) ports 23 send and receive binary signals to and from the control circuit 14 as described further hereinbelow and communicate external binary signals with the data bus 23.

Associated with the control circuit 14 is an external data random access memory (RAM) 24 for reading in and out and processing time related data to be related to the electric energy measurements provided by the meter 10 as described further hereinbelow. The data memory 24 is a four-bit by 256-word solid state low power CMOS random access memory type IM6561 available from Harris Corp. Other subsystems shown in diagram blocks and labeled as to their function will be described further hereinbelow.

Figure 2:
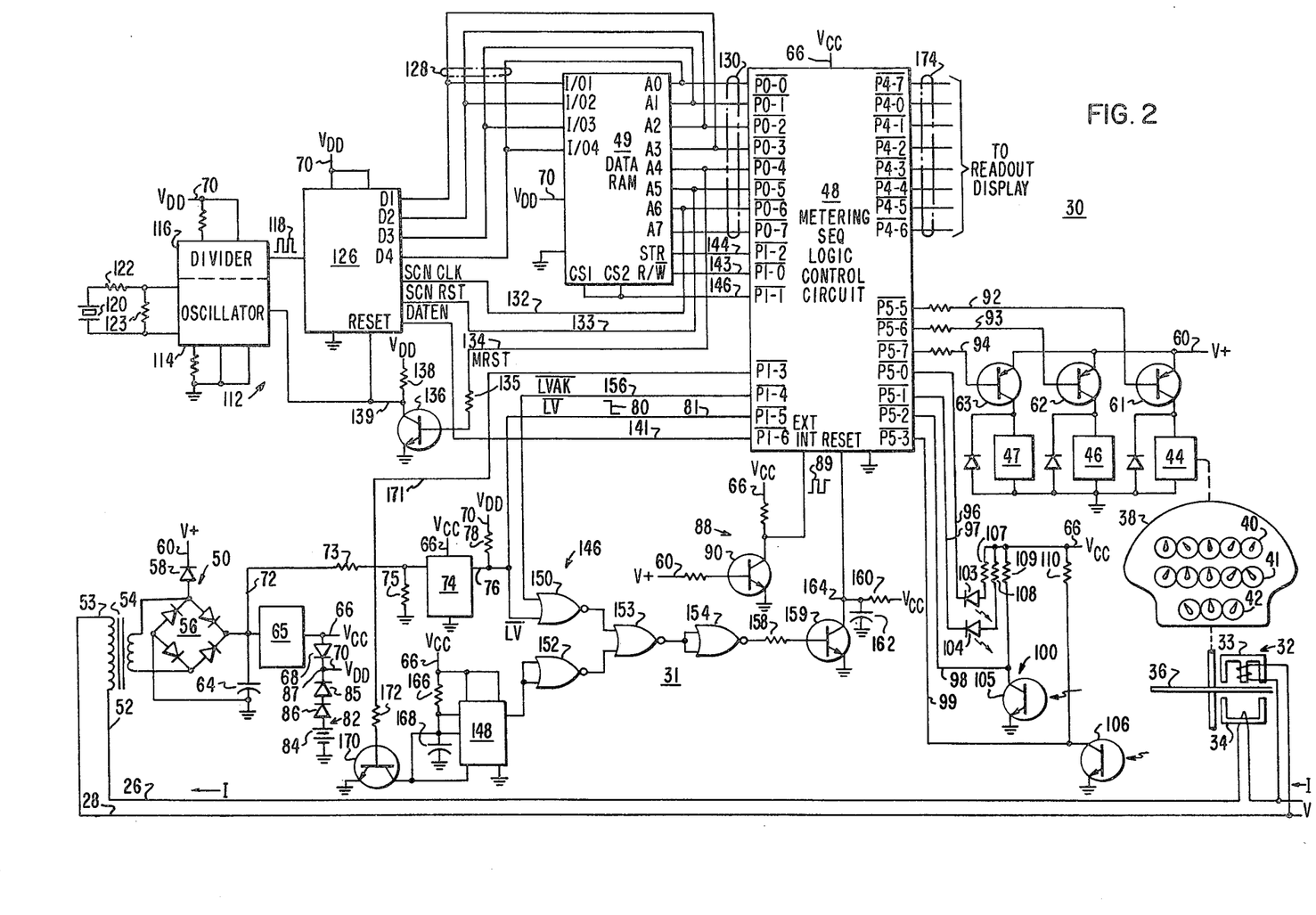
FIG. 2 illustrates an electrical schematic diagram of another embodiment of an electric energy meter having an auxiliary power supply and timer arrangement made in accordance with the present invention.
Figure 3:
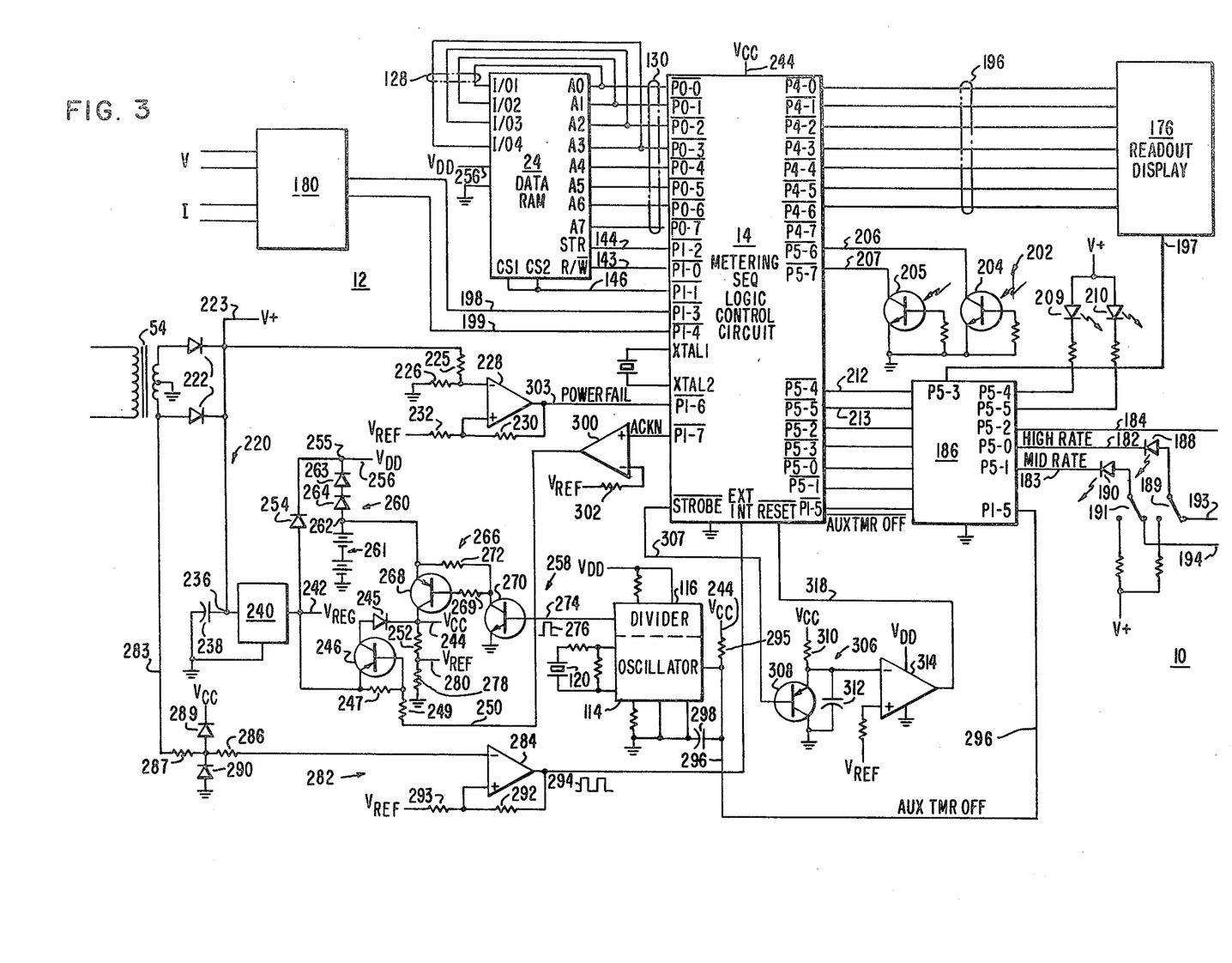
FIG. 3 illustrates an electrical schematic diagram of the meter shown in FIG. 1.

The measuring system 12 is housed in an induction watthour meter enclosure for mounting the meter 10 at an electrical power user's location supplied an electrical energy quantity through the conductors 26 and 28. Typical components of the electrical energy quantity include a power frequency of 60 Hz, a voltage V of 240 volts and a varying current I which varies with the rate of electric energy consumption. FIGS. 2 and 3 disclose not only two different arrangements for different modes of multifunction metering but also two embodiments of auxiliary power supply and timer arrangements usable in either metering system. A detail schematic diagram of the system 12 is shown in FIG. 3 and an alternative meter 30 having a system 31 is shown in FIG. 2.

Referring to FIG. 2, the meter 40 includes an electromagnetic meter movement 32 having a voltage section 33 and current section 34 connected in a conventional manner to the conductors 26 and 28 for driving a shaft supported rotating disc 36 at a rotational rate corresponding to the consumption of the electric energy quantity flowing in the conductors 26 and 28. Induction watthour meter movements such as the meter movement 30 are well known in the art of induction watthour meters. The shaft supporting the disc 36 is geared to a mechanical multidial meter register 38 disclosed in U.S. Pat. No. 4,128,807 issued Dec. 5, 1978, and assigned to the assignee of this invention. The register 38 includes on peak and off peak kilowatt hour dials 40 and 41 and an on peak kilowatt demand set of dials 42 which are intended to be activated and deactivated in response to predetermined time intervals each day to provide one mode of time-of-day metering. A solenoid 44 described in the aforementioned application for controlling the activation of the different dial gear trains of the register 38 is controlled by the control circuit 14. Additional solenoids 46 and 47 are also provided to be controlled by the outputs of the logic control 14 circuit for providing timed switch operations for load control. One solenoid such as the solenoid 46 may be used in addition to the solenoid 44 in a register of the type corresponding to register 38 requiring at least two solenoids for selectively controlling dial gear trains therein.

A metering sequence logic control circuit 48 being of an identical type as described for the logic control circuit 14, is included in the system 31. A data RAM 49 is also included and being the same type as the RAM 24 described hereinabove.

An auxiliary power supply and power outage interval timer arrangement is provided in the programmable time based system 31 in accordance with an important feature of the present invention. Included in the arrangement is a main DC supply 50 that is energized by an AC source formed by the electric energy quantity flowing in the conductors 26 and 28. Accordingly, the AC input conductors 52 and 53 are applied to the input of the DC supply 50. The primary of a step down transformer 54 is connected to the conductors 52 and 53 and the secondary conductors of the transformer are connected to a full wave diode bridge 56. A diode 58 is also connected to the primary of the transformer 54 to produce a half wave rectified output V+ of a twelve volt output of the transformer secondary. The output conductor 60 is connected to the diode 58 to produce a general purpose and unfiltered rectified supply to non-critical circuits and loads of the system 12 including the control solenoids 44, 47 and 48. The supply conductor 60 energizes the solenoids when the switching transistors 61, 62 and 63 are rendered conductive by the control circuit 48.

The full wave rectified output of the diode bridge 56 is applied to a 1000 microfarad filter capacitor 64 and to a voltage regulator circuit 65. The regulator circuit 65 is of a monolithic regulator type 78 MO5CP which produces a regulated direct current five volts $V_{CC}$ at the output thereof. The output of circuit 65 supplies $V_{CC}$ to a first low voltage logic circuit supply conductor 66 and a diode 68 connected to a second low voltage logic circuit supply conductor 70. The second supply conductor 70 supplies $V_{DD}$ which is the same regulated five volts DC as $V_{CC}$ to critical loads of the system 31 upon an outage of the electric energy quantity being supplied to the conductors 26 and 28. Such temporary power outages of electric energy are known in distribution systems typically supplied by electric utility companies. The supply conductors 66 and 70 are to supply those circuits in the system 31 which perform logic circuit functions and associated circuits producing timing signal functions. The first circuit supply conductor 66 supplies $V_{CC}$ to the electronic circuits of the system 31 which are not required to operate during a power outage condition that does not require any measurement of the electric energy. The filter capacitor 64 is connected by a conductor 72 and through resistor 73 to a voltage comparator 74 also having resistor 75 connected to the input thereof. In one preferred form the voltage comparator 74 is a type ICL 8211 and operates to sample the voltage on the filter capacitor 64. The circuit 74 is supplied by supply conductor 66. An output conductor 76 of a voltage comparator 74 is also connected through a resistor 78 to the second supply conductor 70. The comparator output conductor 76 produces a Low Voltage or Power Fail logic signal 80 which is used to signal the control circuit 48 at terminal P1-5 as described further hereinbelow.

An auxiliary DC supply 82 forming another important feature of the present invention includes a standby battery source 84 connected in series with the circuit ground and a diode switching means including diodes 85 and 86 to a circuit junction 88 connected to the second supply conductor 70. The diode switching means, including diodes 85 and 86, has the diodes thereof poled in the forward direction from the positive pole of the battery source 84 to the junction 87. The diode 68 is poled oppositely to the diodes 92 and 93 at the junction 88. Accordingly, when the main DC supply 50 is energized the output of the regulator 65 is applied not only to the first supply conductor 66, but also through the diode 68 to the second supply conductor 70 as noted hereinabove. Upon failure of the DC supply 50, the second supply conductor 70 is supplied power from the battery source 84 through the diodes 85 and 86 and the junction 88. The diode 68 forms a blocking diode to the battery supply to isolate the first supply conductor 66 and the circuits supplied therefrom from the battery 84. The potential of the conductor 66 reverse biases the diodes 85 and 86 in normal operation so that the diodes form a voltage responsive switching operation.

The standby battery source 84 is preferably formed by two separate cells of a lithium iodide or lithium sulfur dioxide type of primary battery which is characterized as being a primary or non-rechargeable type sufficiently small to be mounted in the inside of a compact enclosure of the meter 30 and supply approximately one ampere hour. The battery terminal voltage is in the order of 5.6 volts. The standby battery source 84 being of the lithium iodide type is capable of withstanding temperatures up to 185° F. (85° C.) without substantially affecting its operation or electric energy storage capacity, which are characterized by a long shelf life, when not discharging, rated in terms of several years. When low current is periodically drawn from the batteries, their capacity to supply current is extended over a long lifetime thereof. Accordingly, the battery source 84 does not need recharging or replacement which is highly advantageous when used in a time registering multifunction electric energy meter 30 since many known rechargeable batteries are not capable of withstanding the same high temperatures as is the battery 84 nor is their service life as long as the battery source 84.

Preferably the battery source 84 is two cells of a lithium primary battery type LO325 available from Mallory Battery Co. of Mallory Inc. or a type 440S primary lithium battery available from Power Conversion Inc. Each cell is rated at one ampere hour and has an open circuit voltage of approximately 3.0 volts.

As explained further hereinbelow the second supply conductor 70 supplies the critical circuits of the system 12 which are required to operate during the power outage interval to retain a record of real time or the existing time of day while the first supply conductor 66 supplies the logic control circuit 48 and the non-critical or non-time registering circuits associated with it. Also the general purpose and high voltage DC supply output 60 supplies those circuits not related to the low power logic circuits including the logic control circuit 48 and the data memory 49 thus lowering the burden on the portion of the DC supply 50 supplied by the regulator 65.

In order that the control circuit 48 operate to continuously record and register the real time in seconds, minutes, hours and days, it is required to receive time base signals which are of a constant frequency and preferably integrally related to a one or exact multiples of a second's time interval. Accordingly, a primary timer circuit 88 is provided which has an input connected with the general purpose supply output 60 to receive sixty Hz half-wave rectified signals V+. The signals are applied by the supply conductor 60 through a base resistor to a transistor 90 preferably being of a type 2N2222A. The collector of the transistor 90 is connected through a resistor to the $V_{CC}$ or first supply conductor 66. The transistor 90 forms a square wave generator so that the transistor collector provides first or primary time base timing signals 89 from the collector of transistor 90 to the external interrupt EXT INT input terminal of the control circuit 48. Accordingly, a five volt square wave is applied to the EXT INT input which is connected with the timer and interrupt logic 19 and 20 of the control circuit 48 which has the same configuration as circuit 14 and is operated in the event counter mode disclosed in the afore-mentioned Mostek publication.

The event counter mode of operation counts sixty line cycles of the signal 89 which is equal to a one second time interval. As described in the aforementioned publication the timer 19 is an eight bit binary down counter which is decremented by pulses from the EXT INT. The timer is set to a count sixty and at the sixtieth pulse of signal 89 a timer interrupt is initiated. The timer interrupt is effective to signal the logic circuits of the control circuit 48 that the time registering must be updated and adjust all of the time registering operations thereof. A main or background sequence of operation is occurring for time of usage measurements and is momentarily stopped by the timer interrupt initiated sequence of operations for time keeping. Separate time recording storage is provided within the sixty-four eight-bit registers in the scratchpad 22 shown in FIG. 1. The control circuit 48 stores the accumulated seconds, minutes, and hours of the day so that a separate record of twelve hours A.M. and twelve hours P.M. is maintained. The day of the month and the month of the year is also recorded by the logic control circuit 48 by incrementing the separate registers of scratchpad 22. The program ROM memory 18 of circuit 48 controls the sequence of operations of the control circuit 48 for the mode of operation provided by the system 31. Each second of elapsed time as established by the sixty count of pulses 89 and the timer interrupt is initiated to cause the control circuit 48 to update a seconds counter in scratchpad 22 so as to change the seconds record thereof and if required, adjust the record of minutes and if necessary, adjust the record of hours whenever sixty seconds and sixty minutes are reached. The time updating sequence of operation continues to adjust the record of the day of the week, the day of the year if required.

The time of day registered by the logic control circuit 14 is compared with set points or switch rate times stored in the RAM data memory 49 which correspond to times of predetermined days that one of the solenoids 44, 46 or 48 are to be switched. When the time registered by the logic control circuit 48 matches a time stored in the memory 49 the output data lines 92, 93 or 94 are selectively activated to energize the solid state transistor switch devices 61, 62 or 63 which are supplied by the general purpose supply output 60. The transistor switches 61, 62 and 63 are energized by the P5-5, P5-6 and P5-7 terminals of the control circuit 48 through the data lines 92, 93 and 94 to produce the appropriate time control functions at the register 38.

Four data lines 96, 97, 98 and 99 are connected to terminals P5-0, P5-1, P5-2 and P5-3 to provide external data inputs and outputs at the I/O port's. Radiation responsive external data interface 100 forms a radiation data link 102 shown in FIG. 1 being responsive to electromagnetic radiations to transfer data program information through a radiation transmitting window portion of a meter cover as described in copending U.S. Patent Application Ser. No. 891,997 filed Mar. 31, 1978 and concurrently herewith and is incorporated by reference herein. As disclosed in the aforementioned application the interface unit 100 includes two radiation emitters 103 and 104 and two radiation sensors 105 and 106. The radiation emitters and sensors are supplied through resistors 107, 108, 109 and 110 from the first supply conductor 66.

Referring now to a further important feature of the present invention a secondary timer circuit 112 is included in the system 31 and has a time basis crystal controlled oscillator 114 having an associated divider circuit 116 producing secondary or second time based signals 118. The time base signal source of circuit 112 formed by oscillator 114 divider 116 output is a low power CMOS oscillator/divider circuit type MC 14521B available from the Motorola Corporation. The oscillator 114 has an input from a 32.768 KHz crystal 120 which is connected through resistors 122 and 123 to the crystal input of the oscillator 114. The oscillator/divider circuits 114 and 116 are supplied from the $V_{DD}$ second supply conductor 70 as indicated in FIG. 2. The divider output portion associated with the oscillator 114 comprises a twenty-four stage binary divider. One of the outputs of the divider output 116 provides the secondary time base signals 118 at a rate of once every eight seconds or at eight-second intervals. This output is an integral divided count of the frequency of the crystal 120 which is equal to $2^{16}$.

The eight second time base signals 118 are applied to a counter memory circuit 126 which is formed by a five decade BCD counter preferably formed by a type MC14534B available from the Motorola Corporation. The counter memory 126 is also supplied $V_{DD}$ from the second supply conductor 70 and is effective to count each negative to positive transition of the secondary time based signals 118 so as to be advanced one count every eight seconds. Thus, the counter memory 126 is capable of totaling 99,999 counts which corresponds, at the eight second time base rate, to approximately nine and one-quarter days. The secondary timer circuit 112 is then capable of measuring a power outage interval equal to the nine and one-quarter days and is non-volatile since it is supplied by the auxiliary DC supply circuit 82 during power outages.

The four data lines 128 are connected from the data outputs of counter memory 126 to four data inputs of the RAM data memory 49 and are further connected to the top four lines of the data lines 130 connecting eight address terminals of the memory 49 with eight of the I/O terminals of the control circuit 48. The data lines 130 transfer binary data and address information between the RAM data memory 49 and the logic control circuit 48 and also provide control and readout of the counter memory 126. The three data lines 132, 133 and 134 are connected to three of the data lines 130 and are designated scan clock, SCN CLK; scan reset, SCN RST and master reset, MRST. The five decade counter memory circuit has a scan clock internal logic circuit which outputs one digit (most significant to least significant) at time. The MRST line 134 is applied through a resistor 135 to the base of a transistor 136 preferably of a type 2N2222A. The collector of the transistor 136 is connected through a resistor 138 to the second supply conductor 70 and to line 139 connected to the reset inputs of each of the combined oscillator and divider circuits 114 and 116 and to the counter memory 126. Thereby, the MRST signal is applied to the two reset inputs.

A data enable data line 141 is connected between terminal P1-6 of the I/O ports of the control circuit 48 and the enable input of the counter memory 126. The MRST signal on data lines 134 and 139 resets the counter memory 126 and the oscillator-divider signal output 118 to zero logic state. The SCN RST signal on data line 133 resets the counter memory 49 for outputting the most significant BCD digit of the five counter stages included in the counter memory 126. The four data line outputs of the data lines 128 is a multiplex BCD data and when the SCN RST is activated the most significant digit of the counter memory circuit 126 is applied to the four data lines 128. The SCN CLK data line 132 clocks the transition from a binary zero to a binary one state to advance the counter memory 126 and produce the next significant digit at the four outputs connected with the data lines 128. The control circuit 14 controls the operation of the output of circuit 116 and counter memory 126 to put it into an output mode at the end of a power outage interval, as noted hereinbelow. Accordingly one BCD digit at a time is set from the memory counter to RAM memory 49. The DATEN data line 141 turns off the outputs of the counter memory 126.

The read/write, R/W input of the data memory 49 is connected by line 143 to I/O port terminal P1-0 and the strobe STR input to the memory 49 is connected by line 144 to I/O port terminal P1-2 and the chip select inputs of the memory 49 is connected to the data line 146 connected to terminal P1-1. The later named inputs to the data RAM memory required to condition it for reading and writing data. The supply to the data memory 49 is $V_{DD}$ from the second supply conductor 70 to assure non-volatile supply thereto.

A subsystem 146 is provided in the measuring system 31 to process data signals occurring at the time of the power outage and also to assure that the program sequence of the operation of the control circuit 48 does not get out of synchronism with the program provided in the program memory 18, a so-called program reset operation, which does not form a part of this invention. The subsystem 146 includes a timer 148 of a type 555 and a CMOS NOR gate package type 4001 including four NOR gate circuits 150, 152, 153 and 154. One operation of the subsystem 146 is to respond to the output of the voltage comparator 74 which produces the falling logic signal 80 upon the occurrence of low voltage being developed across the capacitor 82 at the beginning of a power outage condition. The low state of the signal 80 develops a logic low voltage $\overline{LV}$ which is applied to the first NOR gate 150 and develops the input signal 80 to the control circuit 48. This effects signalling to the control circuit 48 that a low voltage condition has occurred and that the control circuit 48 must prepare to store necessary data in the non-volatile data memory 49 and prepare for a power outage which will remove $V_{CC}$ supply from the supply conductor 66. The control circuit 48 goes into a power down sequence of operation in response to the $\overline{LV}$ signal 80 at the I/O port terminal P1-5. Designated low voltage acknowledge, $\overline{LVAK}$ is connected from terminal P1-4 to line 156. The $\overline{LVAK}$ logic goes to a low or binary zero state after $\overline{LV}$ is received.

The gates 152 and 154 have their inputs tied together to form an inverter circuit arrangement and the outputs of gates 150 and 152 are connected through the gate 153 to the common inputs of the gate 154. Upon occurrence of the logic $\overline{LVAK}$ and $\overline{LV}$ at the NOR gate 150 the output of the gate 154 goes to a logic one. The output of the gate 154 is applied to a resistor 158 to the base of a transistor 159 being of a type 2N2222A which has its collector connected through a resistor 160 to the first power conductor 66 and a capacitor 162 at a junction 164 which is connected to the $\overline{RESET}$ input of the control circuit 48. With the output of the gate 154 going to the binary one state, the transistor 159 is rendered conductive and discharges the capacitor 162. The low state at $\overline{RESET}$ prevents the control circuit 48 performing any further sequences of operation. The power outage condition initially causes the $\overline{\text{RESET}}$ input to remain low so long as the low voltage $\overline{\text{LV}}$ and $\overline{\text{LVAK}}$ data lines remain in the low or binary zero state.

The program reset operation of the subsystem 146 is to correct for loss in the sequence of operation of the control circuit 48 which for example, may be caused by spurious signals or noise detected on the various inputs and outputs. The timer 148 provides a missing pulse detector function and has a time constant circuit connected to it formed by the resistor 166 and capacitor 168. The time constant of elements 166 and 168 is such that unless a pulse is applied to a transistor 170, which is a type 2N2222A, then the output of the timer 148 will go to a logic zero. This indicates that a pulse was not applied to the transistor 170 within the time prescribed interval. The data line 171 from the I/O terminal P1-3 is applied to a resistor 172 to the base of the transistor 170. The zero state at the output line of the timer 148 is inverted by the gate 152 which causes a binary one at the input to the transistor 159 thereby initiating a reset in the control circuit 48 which is different than the operation occurring when there is a power outage since the $\overline{\text{LV}}$ logic will not be present to the control circuit 48. A time period of the resistor 166 and capacitor 168 is such that it is the maximum time that would be required by the control circuit 48 to execute its longest sequence program, being in the order of ten milliseconds. The reset operation initiated by the timer 148 causes the control 48 to go back to a known predetermined location in the programmed sequence and continue operation so that no data will be lost or destroyed which is necessary for its proper sequence of operations. As described in the aforementioned Mostek publication the $\overline{\text{RESET}}$ low input causes the circuit 48 to go to first program instruction in ROM 18.

Not forming a part of the present invention are eight data lines 174 connected to eight terminals of I/O port 4 of the control circuit 48 and to an electronic display device 176 shown in FIG. 1 which is capable of displaying time or status data relating to the operation of the system 31.

In operation of the measuring system 31 and particularly in operation of the main DC supply 50 auxiliary DC supply 82 and the primary and secondary timer circuits 84 and 112 in FIG. 2, a power outage condition of the conductors 26 and 38 switches to the auxiliary arrangement. During normal operation for measuring the electric energy flow of conductors 26 and 28, the $V_{CC}$, $V_{DD}$ and V+ supplies are provided by the transformer 54 and main DC supply 50. During normal operation the general supply conductor 60 will be energized from the rectifier bridge 56 and the first and second supply conductors 66 and 70 will be supplied from the regulator circuit 65. The filter capacitor 64 will be fully charged so that the comparator circuit 74 will be in a high state indicating that there is no low voltage. The power conductor 60 will be supplying unfiltered V+ at sixty Hz. First time base signals 89 from the primary timer 84 will cause real time accumulation in circuit 48.

As a power outage occurs, deenergization of the main supply input conductors 52 and 53 occurs. The voltage on the filter capacitor 64 will lower causing a $\overline{\text{LV}}$ data signal to be true to the logic control circuit 48. The $\overline{\text{LVAK}}$ signal will produce a reset binary signal at the output of the transistor 159 and to the $\overline{\text{RESET}}$ input to effect a reset cycle of operation in the circuit 48 and not prevent any further operation so long as $\overline{\text{LV}}$ and $\overline{\text{LVAK}}$ are zero. The MRST data signal will reset the oscillator output 118 to zero as well as the counter memory 126 to zero. The oscillator 114 is released so as to begin operation of the secondary timer circuit 112 to begin to initiate the eight second time base signals 118. Just before outputting $\overline{\text{LVAK}}$ the control circuit 48 will store the latest current time data information from its scratchpad register 22 through the data lines 130 to the data memory 126. As power is removed at supply 66, the circuit 48 is deenergized.

The auxiliary DC supply 82 is activated, by the diodes 85 and 86 no longer being reversed biased since the $V_{CC}$ is lost so that the voltage of the standby battery source 84 is applied to the second supply conductor 70 exclusively. The second supply conductor will supply $V_{DD}$ to only critical low power consuming devices, indicated as having supply from the second supply conductor 70 in FIG. 2, to provide power outage interval operation. The secondary or second time base signals 118 are counted and stored in the counter memory 126 throughout the duration of the power outage interval. At the end of the power outage interval the electric energy quantity to be measured returns to the supply conductors 26 and 28 and the second supply conductor 70 will begin being supplied from the regulator 65 through the diode 68 since the standby battery source 84 will be disconnected from the supply conductor 72 due to the reversed biased state of the diodes 85 and 86. The unique arrangement requires only twenty microamperes from the battery source 84 to supply the RAM memory 49 and secondary timer circuit 112.

As described hereinabove the number of counts accumulated during the outage interval by the counter memory 126 will be read out at the BCD outputs of the data lines 128 so that the duration of the outage interval will be stored in the data memory 126. Thus, the recorded time that the outage started which is stored in the memory 49 and which has remained nonvolatile by virtue of the operation of the auxiliary DC supply 82 can be updated by the BCD eight second counts and loaded back onto the scratchpad registers 22. The sequence of operation for reestablishing the current time by the control circuit 48 is initiated by the first eight second pulse occurring in the second time base signals 118 after the end of the power outage.

Referring now to the FIGS. 1 and 3 wherein FIG. 3 shows in electrical schematic diagram of the time registering multifunction electric energy meter 10 shown in FIG. 1 including the programmable time based metering system 12 forming a different form of the present invention from that described in connection with the description of FIG. 2. The metering sequence logic control circuit 14 shown in FIG. 1 uses the same microprocessor chip type MK 3870 included in the control circuit 48. The program memory 18 controls the control circuit 14 for a different sequence of operations from the operations of the system 31 of FIG. 2 since its mode of measuring is different in using the register 38. The same data RAM forms the memory 24 as utilized in the system 31 with the same connections of the data lines 130 between the control circuit 14 and data memory 24. The control circuit 14 provides an important additional function from that of keeping a record of a real time or time of day and the set points described hereinabove for producing time control of output data lines 92, 93 and 94 in FIG. 2.

The system 12 measures different time of usage parameters from an electric energy to pulse rate converter 180 described further hereinbelow. Data lines 182, 183 and 184 corresponding to lines 92, 93 and 94 are connected to a buffer circuit 186 formed by a transistor array type CA 3081 available from the RCA Corporation. The data lines 182, 183 and 184 are connected through the buffer 186 to the terminals P5-3, P5-0 and P5-2, respectively. In accordance with the time based operation of the system 12, the data lines 182 and 184 are activated during an on-peak or high rate time and the data line 183 is activated during an intermediate or shoulder peak time. The line 182 is connected in series with an on-peak or high rate LED indicator 188 and a single pole double throw switch 189. The data line 183 is connected in series with an intermediate peak or midrate LED indicator 190 and a single-pole double-throw switch 191. Further connections to the switches 189 and 191 may be made to the solenoids 44 and 46 at lines 193 and 194 and line 184 may be connected to solenoid 47 to provide exclusive load control rather than control of the register 38 in FIG. 2. Further outputs which do not form a part of this invention include the seven data lines 196 and data line 197 connected as shown between the control circuit 14 and the optoelectronic display 176.

The system 12 includes the electric energy to pulse rate converter 180 which is formed by a pulse initiator circuit including two light emitting diodes and two photo-transistor radiation detectors, not shown, connected to data lines 198 and 199. The pulse initiator converter circuit 180 initiates electronic impulses on the data lines 198 and 199 in response to the rotation of a watthour meter disc such as disc 36 shown in FIG. 2. The pulses are applied to terminals P1-3 and P1-4 at a pulse repetition rate responsive to the rate of consumption of the electric energy quantity to be measured and flowing in the conductors 26 and 28 shown in FIGS. 1 and 2. The converter 180 and equivalents are well known in the art for providing a source of metering pulses and examples are disclosed in U.S. Pat. Nos. 3,733,493, issued May 15, 1973, 3,874,391, issued Apr. 15, 1975, and 3,943,498, issued Mar. 9, 1976, all assigned to the assignee of this invention. All electronic circuits are known for receiving voltage and current inputs and producing electric energy to pulse rate conversion as disclosed in U.S. Pat. Nos. 2,056,774 issued Nov. 1, 1977 and 3,764,908 issued Oct. 9, 1973, both assigned to the assignee of this invention. As set forth in one or more of the aforementioned patents each pulse produced in the metering pulse output of the converter circuit 180 is representative of a predetermined quantum of kilowatt hours so as to have a pulse energy (KWHR/pulse) value $K_e$. Constants such as $K_e$ are used in the control circuit 14 to calculate the kilowatthour or kilowatt demand represented by pulses.

The radiation data link 102 shown in FIG. 1 includes an interface unit 202 in FIG. 3 that is equivalent to the unit 100 of FIG. 2 and is disclosed in the aforementioned U.S. Patent Application Ser. No. 891,997. The radiation responsive external data interface 202 is connected so that first and second radiation sensors 204 and 205 are connected to data lines 206 and 207. Accordingly, first and second radiation emitters 209 and 210 are connected through the buffer 186 to the data lines 212 and 213, respectively.

As noted above, the program memory 18 of the control circuit 14 is fixed and the RAM data memory 24 requires certain data to be stored therein which is applied through electromagnetic radiation sending and receiving interface 202. The sequence of operation provided by the program memory 18 requires certain data quantities in RAM memory 24 to effect the sequence of operation for the measuring system 12.

The metering sequence logic control circuit 14 effects a current time or time of day timer interrupt routine sequence of operation similar to that described for the control circuit 48 in which a seconds counter, a minutes counter, an hours counter, and a day of the week counter in separate registers of the scratchpad registers 22 are continuously updated on a one second basis for comparison with a programmed rate selection memory table. The time updating is performed in response to the timer interrupt operation, described above, wherein primary sixty Hz timing signals are applied to the EXT INT input of the circuit 14. In the measuring system 12, time registering and accumulating registers are provided in the RAM memory 49 that contain the same time data as corresponding registers do in scratchpad registers 22. Accordingly, there are registers in memory 24 for a seconds counter, a minutes counter, an hours counter, and a day of the week counter, for example.

Referring now in particular to the auxiliary power supply and outage timer arrangement of the measuring system 12 shown in FIG. 3, a main DC supply 220 is energized through the step-down transformer 54 in the same manner as shown in FIG. 2 from the conductors 26 and 28 conducting the electric energy quantity to be measured. A two diode bridge 222 provides rectified voltage to a general purpose or unfiltered supply conductor 223 producing V+ generally corresponding to the supply conductor 60 in the system 31. The output V+ of the bridge 222 is applied through resistors 225 and 226 to one input of a Power Fail comparator 228 which may be of a type MC3302P including four such comparators described herein. Resistors 230 and 232 are connected to the other comparator input and the output and $V_{REF}$ as shown.

The output of the bridge 222 is further connected to a junction 236 between a 330 microfarad filter capacitor 238 and the input to a voltage regulating circuit 240 which is preferably of a type MC78M06 available from Motorola Corp. The capacitor 238 and voltage regulator 240 correspond to the capacitor 64 and regulator 65 of FIG. 2. A $V_{REG}$ output of the regulator 240 supplies first and interruptible or volatile DC supply conductor paths including the conductor 242 and a $V_{CC}$ conductor 244 which is connected to the output of the regulator 240 through the diode 245 and the emitter to collector circuit of a switching transistor 246 preferably of a type 2N2907A. A biasing resistor 247 is connected between the emitter and base of the transistor. The base input circuit is connected to a resistor 249 connected with the base input line conductor 250. The supply conductor 244 is connected to a circuit junction between diode 245, a resistor 252 and supplies $V_{CC}$ the control circuit 14.

The output of the regulator 240 is further connected through a diode 254 connected in the polarity shown with the cathode terminal connected to the junction 255. The junction 255 is connected to a second and uninterruptible or non-volatile DC supply conductor 256. The second supply conductor 256 is connected to supply $V_{DD}$ to the data memory 24 and the oscillator 114 and divider 116 circuit as described for the system 31 shown in FIG. 2. The oscillator 114 is included in a secondary timer circuit 258 described further below.

An auxiliary DC supply 260 circuit includes a standby battery source 261 including two non-rechargeable lithium batteries the same as battery source 84. A voltage responsive diode switching means includes the diodes 263 and 264. The second supply conductor 256 is supplied $V_{DD}$ from the battery source 261 through the junction 262 and the diodes 263 and 264 upon a power outage causing deenergization of the transformer 54 of the main DC supply as described for energization of the conductor 70 in FIG. 2.

In FIG. 3 there is shown a time based power pulsing circuit 266 including a transistor switch 268 having the emitter to collector circuit thereof connected between the positive terminal of the battery source 261 and power conductor 244. The base of the transistor 268 is connected through a resistor 269 to the collector of a control transistor 270 having a resistor 272 connected between the collector thereof and the emitter of the transistor 268. The transistor 270 is formed by a type 2N2222A and the transistor 268 is formed by a transistor type 2N2907A. The base of the transistor 270 is connected to a conductor 274 connected further to a second time based signal output of the oscillator/divider circuit 114-116 which produces secondary time based pulse signals 276. The base of the transistor 270 receives the signals 276 to render it conductive and in turn drive the transistor switch device 268 into full saturation to provide a connection between the output of the standby battery source 261 and the junction with the supply conductor 244. The conductor 244 is further connected through resistors 252 and 278 to ground with the junction between the last-named resistors connected to a DC reference supply $V_{REF}$ conductor 280. The conductors 244 and 280 are normally energized by the main DC supply 220 from the regulator 240 when a high logic state on the conductor 250 renders the transistor switch 246 conductive. During a power outage, momentary secondary or second time based signals 276 on the conductor 274 momentarily connect the supply conductors 244 and 280 from the standby battery source 261 for purposes which will become more apparent with the description of the operation of the system 12 during a power fail outage described hereinbelow.

Referring now to a primary timer circuit 282 and the secondary timer circuit 258 already partially referred to, the primary timer circuit 282 is connected to the output of the transformer 54 by the conductor 283 and supplies sixty Hz first time base signals to the data line 284 connected to the INT EXT input of the logic control circuit 14. The secondary timer circuit 258 includes the oscillator 114 having a divider output 116, noted hereinabove, the second and secondary time base pulse signals 276 are provided on the data line conductor 274 connected to the power pulsing circuit 266.

The primary timer circuit 282 includes a comparator 284 having one input connected to the resistors 286 and 287 and to the conductor 283. The junction of the two resistors are connected to the junction of diodes 289 and 290 and the diodes are connected across the supply conductor 244 and ground. The other input of the comparator 284 is connected to the junction of resistors 292 and 293 which are connected in series with the DC reference supply conductor 280 and the output of the comparator 284. The comparator receives the rectified sixty Hz signals from the conductor 283 and converts them to the square wave first time base signals 294 applied to the EXT INT input of the control circuit 14. As noted hereinabove, the control circuit 14 interrupts one metering sequence of operation to go to a time registering operation once every sixty counts of the primary time base signals 294 to update the current time of day and day of the week registers in the scratchpad registers 22 and RAM memory 24 once each second.

In the secondary timer circuit 258 the oscillator 114 includes the 32.768 KHz crystal 120 as previously described, however, the secondary time based signals 276 are produced at a repetition rate of once every four seconds rather than once every eight seconds. The reset input to the oscillator 114-divider 116 circuit is connected at the junction of a resistor 295 which is connected to the $V_{CC}$ supply conductor 244 and a data line 296. A capacitor 298 is connected between the reset input and ground. The data line 296 is connected to the buffer 186 so as to be connected to the data line from terminal P1-5 providing an auxiliary timer off $\overline{\text{AUX TIMR OFF}}$ logic signal from the control circuit 14. The logic state of the AUX TIMR OFF is normally high on the conductor 296 so as to maintain the power pulsing circuit 286 inactive by divider output 274 being kept in a low binary state. The data line 250 which is connected to the base of the transistor switch 246 is connected to the output of a comparator 300. One input to comparator 300 receives a data line from terminal P1-7 designated power fail acknowledge ACKN. The other input is connected through a resistor 302 to the DC reference supply $V_{REF}$. The binary logic circuit on the ACKN line 250 is normally low when there is no power failure outage being detected. The low output of the comparator maintains the transistor switch 246 in an activated and conductive state so that the $V_{CC}$ and $V_{REF}$ supply conductors 244 and 280 are being supplied from the output of the regulator 240.

The comparator 228 described hereinabove has an input connected to be responsive to the voltage across the filter capacitor 238, with such capacitor voltage effected by the AC energization being provided at the input of the transformer 54. The comparator 228 outputs POWER FAIL logic signal on the data line 303 applied to terminal P1-6 of the control circuit 14 when energization fails. While AC energization is present the high voltage state on the capacitor 364 provides a low binary state on the data line 303 to the control circuit 14. When the voltage on the capacitor 238 begins to drop in response to a loss of AC energization the POWER FAIL on line 303 will go to a high binary state.

The controller sequence control or program reset circuit 306 receives a $\overline{\text{STROBE}}$ output applied to the data line 307 which is applied to the input of a transistor 308 having a timing circuit connected thereto including the resistor 310. The timing circuit is capacitor 312 connected as shown in FIG. 3 and applied to one input of a comparator circuit 314 being supplied by the $V_{DD}$ supply conductor 256. The resistor 310 is connected between the transistor emitter and the $V_{CC}$ supply conductor 244. The other input to the comparator 314 is connected through a resistor 316 to the $V_{REF}$ reference supply conductor 280. The output of the comparator 314 applies a logic signal on the data line 318 to the $\overline{\text{RESET}}$ input of the control circuit 14. Each time the controller outputs signals to the display on the port 4 data lines 196, the $\overline{\text{STROBE}}$ logic on data line 307 goes low causing the transistor 308 to saturate and discharge the charge on the capacitor 312 to ground. The time constant of the circuit including the resistor 310 and capacitor 312 is such that it will not rise to a level sufficient to trigger the comparator circuit 314 for a predetermined time duration which as noted hereinabove is in the order of 10 microseconds which is the time required for the controller to run through the longest program sequence thereof. If the $\overline{\text{STROBE}}$ pulse does not appear within the predetermined time interval the voltage on the capacitor 312 will raise to the trigger level of the comparator 314 which will produce the logic signal on line 318 and cause a reset operation within the control logic 14 to bring it back to a known place in its program sequence of operation.

In operation of the system 12 and particularly in operation of the auxiliary power supply and timer outage arrangement, the logic control circuit 14 will normally be providing a main routine of sequence of operation wherein the pulses on lines 198 and 199 are accumulated in RAM memory 24 in a time of usage basis i.e. kilowatthour and watt demand pulse counts in the current rate registers. The pulses are converted to actual kilowatthour and watt demand values to be displayed or read out in coded pulses. The timer routine and time registering squence of operation interrupts the main routine once each second after receiving the sixty primary time base signals 294 from the comparator 284 which activates the timer interrupt routine within the logic control circuit 14, as noted above. The normal measuring and time keeping operations of the control circuit 14 are maintained so long as the POWER FAIL logic is not true.

Whenever an interruption occurs in the AC electric energy quantity being measured of the conductors 26 and 28 shown in FIG. 1, the main DC supply 220 begins to be deenergized and the voltage across the capacitor 238 begins to drop causing the comparator 228 to initiate a true logic state on the data line 303 indicating a power failure condition. The controller circuit 14 initiates a power down routine sequence of operation and stores the data which is necessary to maintain a record of time and date and usage of power and usage of energy is updated in the data memory 24. The control circuit 14 conditions itself to be turned off by interruption of the $V_{CC}$ supply at the supply conductor 244. Since there is no electrical energy quantity flowing in the conductors 26 and 28 there is no need for sampling and calculation of non-existent metering pulses on the data lines 198 and 199. As described further hereinbelow the pulsing of the supply conductor 244 connected to the control circuit 14 need only be long enough to update the time registrations of the time of day accumulating registers in the RAM memory 24. The act of turning on the control circuit 14 by the supply at the conductor 244 occurs once each four seconds so that the time registers in the RAM memory 24 are updated by a four second amount during the power failure outage interval.

Figure 4:
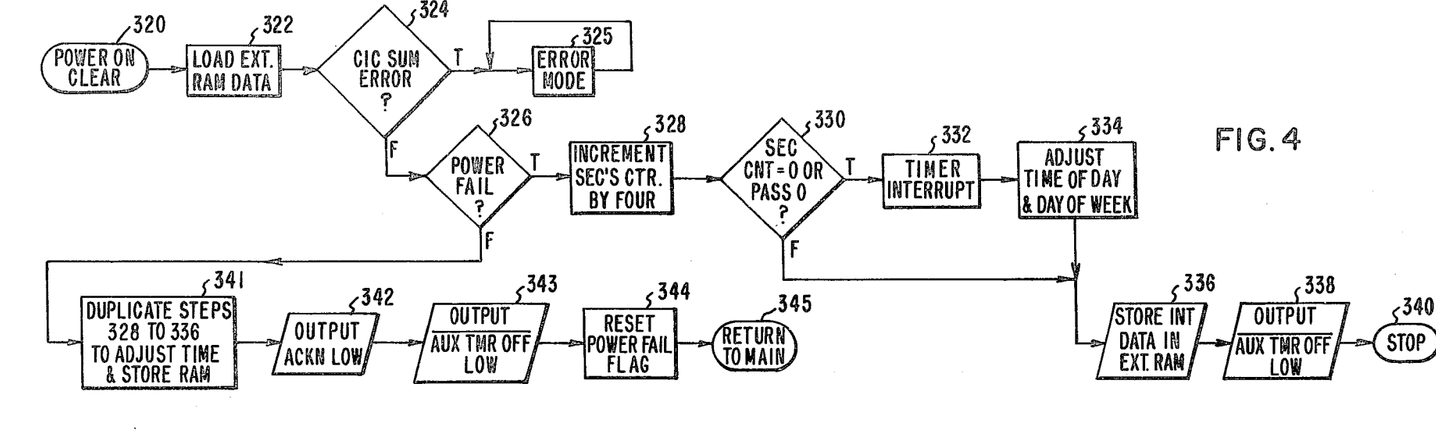
FIG. 4 illustrates a flow chart diagram of a sequence of operations of the meter shown in FIGS. 1 and 3.

Briefly, the sequence of operation during a power outage interval is reviewed in the flow chart of FIG. 4. The control circuit 14 receives the $V_{CC}$ and goes to the standard Power On clear, at step 320, operation of the Type MK3870 microprocessor which starts at the beginning by loading data from registers of RAM 24 at step 322. A check sum error is done to verify that the data is correct at step 324 and goes to step 325 if true. Power fail is checked at step 326. This will continue to be true during a power outage so that the circuit 14 will update the seconds counter at step 328 by four seconds since during a power outage, power will be always on every four seconds. If the seconds counter has accumulated sixty seconds the decision step 330 is true. The timer interrupt is initiated at step 332 as it is when the timer register 19, shown in FIG. 1, requires when it has counted sixty time base signals. The time of day is adjusted at step 334 beginning with the minutes counter. The interrupt routine ends and the circuit 14 stores the scratchpad memory in RAM memory at step 336. The AUX TMR OFF logic is applied to terminal P1-5 at step 338 and the circuit 14 prepare for power to be removed at step 340, the end of the Power Down Routine.

If power outage ends, the decision step 326 will be false and the time will be adjusted and the RAM memory will be loaded at step 341 the same as in steps 328 through 336. Since AC energy has returned, the control circuit 14 returns to normal operation by setting the ACKN and $\overline{\text{AUX TMR OFF}}$ to a low binary state at steps 342 and 343. The power fail logic is reset at step 344 and the operation returns to the main measuring routine at step 345.

Figure 5:
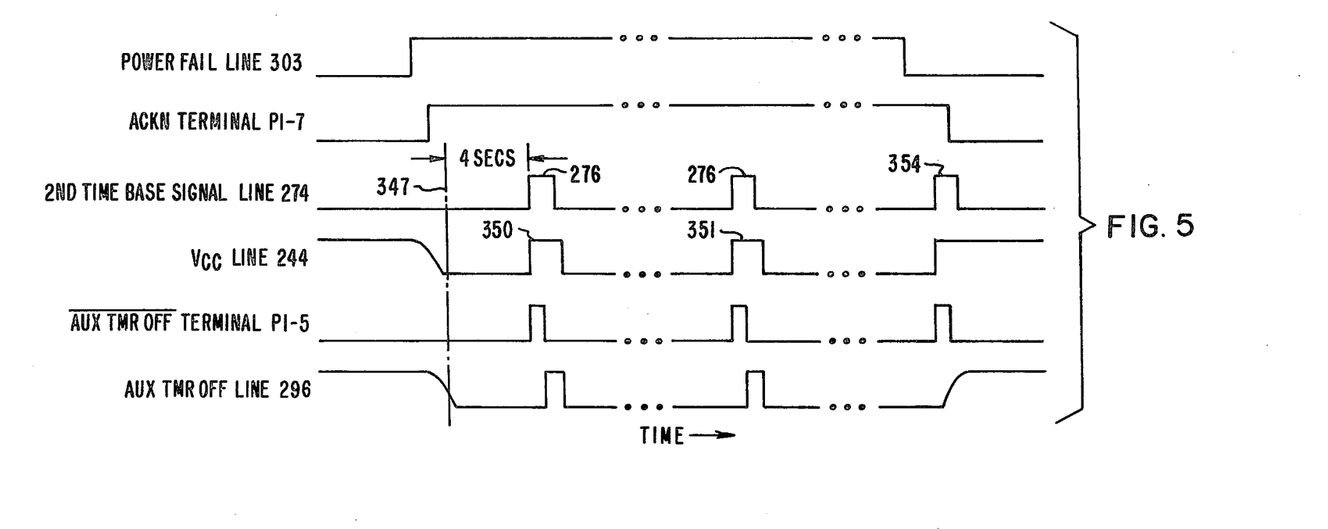
FIG. 5 illustrates a time graph of signals occuring in electrical schematic diagram of FIG. 3.

In describing the auxiliary power supply and outage timer of FIG. 3, reference is made to the graph of signals of FIG. 5 showing signals at the designated locations. The system 12 is initially turned and energized by connection of the standby battery source 261 of the auxiliary DC supply 260. The battery material terminal voltage is in the order of five and one-half to six volts and is developed at the junction 262 until AC energy is received. The voltage at the DC supply conductor 256 is selectively applied to the circuits of the system 12 as described hereinabove. The oscillator 114 of the secondary timer continues to be energized as well as the data memory 24. Upon application of the supply from the conductor 256, the oscillator timer begins to cycle and after four seconds a high output is provided in the secondary time based signal 276 to turn on the power pulsing circuit 266. Direct current is connected from the battery source 261 to the $V_{CC}$ supply conductor 244 connected to the control circuit 14 and also to the DC reference supply conductor 280 to the selected circuits as shown. During this time the main DC supply 220 is isolated from the battery source 261 due to the reversely biased diode 254.

The initial $V_{CC}$ supply at the conductor 244 to the control circuit 14 initiates a power-on clear sequence of operation which is effective to set all output ports and associated data lines to the initialized state which is a binary logic one. This causes $\overline{\text{AUX TMR OFF}}$ to go to a high state. Since in the initial condition being described there is no AC voltage applied to the transformer 54 and no voltage developed across the capacitor 238, the comparator 228 will provide a high true logic state indicating that there is power failure at the input to the transformer 54. Similarly, immediately after receiving power from the transformer 54 it will not have reached a sufficient amplitude to have the supply system six volts being provided at the output 242 of the regulator 240. The logic control circuit 14 will then begin the power down sequence of operation which tries to adjust the time and restore the data into the data memory 24.

If the data memory has not been programmed, a check of the eight digit check sum which is a sum of the constants and calculation functions stored in the data memory will not check so that the control circuit 14 detects an error. In this initial condition, the control circuit 14 will output an AUX TMR OFF signal on the data line 296 to reset the oscillator timer to go to a high or binary one state. This causes the oscillator-divider output to go to a logic zero state and turn off the power pulsing circuit 266 and remove the supply from the conductors 244 and 280 and, accordingly, the control circuit 14. The oscillator 114 will then output after four seconds and a similar sequence will occur to pulse the $V_{CC}$ supply to the control circuit 14. However, if the initial condition will have supplied the energization to the transformer 54, the regulated DC supply value will occur at the output supply conductor 242 to assume normal operation. When the control circuit 14 tests the data line 303 it will find that power is being supplied and it can go into its normal sequence of operation at the time after the data memory 24 is programmed for metering operation. Even if AC energization has not been applied and when the metering data is programmed into memory 24, the system is fully operative to maintain current time since it will be supplied from the battery source 261. After program input to control circuit 14 from the data memory 24, the calculation constants and conversion factors will be thereafter stored and the check sum routine by the control circuit 14 will be verified and the operation will continue on a normal basis.

During normal operation of the main measuring and timer interrupt sequence of operation, the POWER FAIL at the input of the data line 303 will also be periodically checked to determine whether or not the control circuit 14 should go into an initial power down routine which is different from that shown in FIG. 4.

Briefly reviewing the operation of the auxiliary power supply and outage timer arrangement, a normal operation is assumed to be in process with AC energization. A loss of AC energization of the main DC supply 220 initiates the POWER FAIL high signal on the data line 303 as shown in the top signal graph in FIG. 5. The circuit goes into the initial power down routine, not shown in FIG. 4, which simply includes storage of the current time of day and date data into the memory 24. Thereafter the ACKN is sent high from terminal P1-7 to acknowledge that the time data is stored in RAM memory 24 and the circuit 14 is turning off. The primary timer circuit 282 will be deactivated by deenergization of the AC energization and the first time base signals 294 will cease being applied to the INT EXT input. The ACKN logic to the comparator 300 deactivates the transistor switch 246 to remove the DC supply conductors 244 and 280 from the output of the regulator 240. $V_{CC}$ and $V_{REF}$ drop to zero and the circuits supplied thereby are deenergized including circuit 14. $V_{DD}$ is now provided by the battery supply 261. In FIG. 5 $V_{CC}$ first goes low to remove the voltage through resistor 295 to the oscillator 114 and divider 116 so they are removed from the set condition and the oscillator 114 begins running. $V_{CC}$ going low also causes the AUX TMR OFF to go low and the time reference line 347 indicates the time that this occurs and the oscillator starts. The graph of the signals in FIG. 5 are not scale relative to time but are illustrative of their sequence of occurrence. After the indicated four seconds, the initial one of second time based signals 276 on line 274 at the divider output goes to a high or binary one logic to produce pulse 350 at the conductor 244. Pulse signal 276 turns on the time based power pulsing circuit 266 to connect the junction 262 and standby battery source 261 to the $V_{CC}$ and $V_{REF}$ supply conductors 244 and 280. Power is applied to the logic control circuit 14 which goes to the Power On Clear sequence which raises the $\overline{\text{AUX TMR OFF}}$ to a high state. The inverted output thereof on line 296 does not go high because of the presence of $V_{CC}$. The time keeping update occurs as described in FIG. 4 and at the end, $\overline{\text{AUX TMR OFF}}$ is lowered and then AUX TMR OFF on line 296 raises due to $V_{CC}$ pulse 350. This resets the oscillator 114 and causes line 274 to go low. The pulsing circuit 266 is turned off to turn off $V_{CC}$ at the end of pulse 350. The pulse 350 causes circuit 14 to be only momentarily energized for additionally conserving the capacity of the standby battery source 261 and in the order of 200 microseconds to two milliseconds. The line 296 goes low with $V_{CC}$.

The ACKN signal stays at a high true after POWER FAIL occurs and stays high until the first Power On Clear sequence after AC energization occurs to end the power outage. The oscillator 114 and the data memory 24 remain continuously supplied by $V_{DD}$ so as to have a non-volatile operating condition by being supplied from the standby battery source 261. Thus, the current time of date data and the data memory 24 is kept active and no loss of time occurs. The circuit 14 is cycled on every four seconds by subsequent $V_{CC}$ pulses such as pulse 351 to update current time data.

When the AC energization of the main DC supply 220 returns, the standby battery source 261 is switched off from the conductor 256 and the pulsing circuit 266. The POWER FAIL goes low but the ACKN stays high and the control circuit remains deenergized to wait for the next and last four second time base pulse signal 354 occurring in a power outage interval and after the return of the AC energy. The Power On Clear sequence begins by $V_{CC}$ going high also raising $\overline{\text{AUX TMR OFF}}$ while the time is updated at the step 341 in FIG. 4. AUX TMR OFF stays low because of $\overline{\text{AUX TMR OFF}}$ being high in FIG. 5. When time adjust is completed ACKN goes low to energize $V_{CC}$ through transistor 246 and $\overline{\text{AUX TMR OFF}}$ goes low to let AUX TMR OFF go high and set the oscillator 114. The last pulse 354 of the pulses 276 goes low and and line 224 stays low due to the return of $V_{CC}$ continuing high.

Utilizing the aforementioned type of non-rechargeable or primary lithium type of standby battery sources the systems 12 or 31 are capable of operating for many years of operation under normally expected durations of power outages while being operable in varying and especially high temperature ambient conditions without degradation of the capacity of the primary batteries. In the measuring systems 12 and 31 described above, the battery sources are capable of supplying the critical logic circuit portions in the order of fifty days. Average electric energy distribution systems do not accumulate this length of power outage times for many years. Thus, the meters 10 and 30 do not have to be tended to or serviced because of the battery sources for extended time.

We claim:

1. A time registering electric energy meter for maintaining time of day data during power outage conditions of an AC energy quantity to be measured by the meter, said meter comprising:

main DC power supply means having an output solely energizable by the AC energy quantity to be measured with said output being connected to first supply conductor means;

primary timer means generating first time base signals in response to the frequency of the AC energy quantity to be measured;

means producing variable and repetitive representations of incremental values of the AC electric energy quantity to be measured;

metering sequence logic control means energized by said output of said main power supply means and including real time measuring means for registering time of day data in seconds, minutes, hours and day of the week in response to said first time base signals;

accumulating register means responsive to the time registrations of said metering sequence logic control means and the variable and repetitive representations for totalizing at least one measured parameter of the quantity to be measured in either of at least two time of usage categories;

auxiliary DC power supply means including an output connected with second supply conductor means, first unidirectional conducting means connecting said first supply conductor means with said last named output so as to electrically isolate said output in a reverse direction of polarity thereof, said auxiliary supply means further including a standby battery source and a voltage responsive switch means including second unidirectional conducting means connecting said battery source to said output in a reverse direction of polarity with respect to said first unidirectional conducting means so as to be responsive to loss of energization of said output of said main supply means for selectively energizing said output of the auxiliary supply means in response to power outage conditions of the AC energy quantity and continuously energize said second supply conductor means;

secondary timer means energized by the energized output of said auxiliary DC power supply means through said second supply conductor means to produce second time base signals having a longer time value than the time value of said first time base signals; and electronic memory means energized by both said output of said main DC power supply means and the selectively energized output of said auxiliary DC power supply means through said second supply conductor means for storing the current time registrations of said logic control means in response to the beginnings of said power outage conditions and for storing further time registrations during said power outage conditions in response to said second time base signals.

2. A time registering electric energy meter as claimed in claim 1 wherein said standby battery source includes a lithium type primary battery.

3. A time registering electric energy meter as claimed in claim 2 wherein two lithium type batteries are included and connected in series to provide approximately six volts across the series connected batteries.

4. A time registering electric energy meter as claimed in claim 1 wherein said secondary timer means includes a crystal controlled oscillator.

5. A time registering electric energy meter as claimed in claim 4 wherein said secondary timer means includes a divider circuit connected with said oscillator and producing said second time base signals.

6. A time registering electric energy meter as claimed in claim 5 wherein said first time base signals and said second time base signals are both produced at different time intervals each being equal to an integral number of seconds.

7. A time registering electric energy meter as claimed in claim 6 wherein said oscillator has a frequency of 32.768 KHz and said second time base signals are produced at intervals less than ten seconds and said first time base signals are produced at one second intervals.

8. A time registering electric energy meter as claimed in claim 7 wherein said electronic memory means includes a counter memory means for storing the accumulated count of said second time base signals occurring during the time intervals of the powr outage conditions.

9. A time registering electric energy meter as claimed in claim 8 wherein said counter memory means is a five stage BCD coded type capable of storing a maximum of 99,999 counts of said second time base signals.

10. A time registering electric energy meter as claimed in claim 9 wherein said BCD count of said counter memory means occurring at the end of the power outage condition is representative of the time interval of the power outage condition in seconds for adding to the storage current time registrations established at the beginning of the power outage condition to maintain an updated registration of current time at the end of the power outage conditions.

11. A time registering electric energy meter for measuring an AC electric energy quantity and maintaining time of day data during power outage conditions of the AC electric energy quantity, said meter comprising:

means producing variable and repetitive representations of incremental values of the AC electric energy quantity to be measured;

main DC supply means energizable from the AC electric energy quantity to be measured, said main DC supply means including an output connected to first supply conductor means;

auxiliary DC power supply means including a standby primary battery source;

voltage responsive switch means connecting said auxiliary DC supply means to a second supply conductor means when said first conductor means is deenergized from said main DC supply means;

a source of primary time base signals energized by the AC energization of said main DC supply and producing said primary time base signals at a frequency responsive to the frequency of the AC energy quantity to be measured;

metering sequence logic control circuit means including a supply input connected to said first supply conductor means, a timing signal input connected to said source of primary time base signals for registering real time in an internal random access memory portion thereof for establishing time of usage parameters of said variable and repetitive representations and further including input/output terminals for transmitting and receiving data logic signals;

data memory means energized from said first and said second supply conductor means and including data input/output terminals and address input terminals both directly connected to predetermined ones of said input/output terminals of said metering sequence logic control circuit for receiving both the real time data registrations of said logic control circuit means and memory address data from common input/output terminals of said metering sequence logic control circuit at the beginning time of the power outage conditions to non-volatilely store said time data registrations during the power outages;

a source of secondary time base signals energized by said second supply conductor means and including an oscillator circuit producing a substantially fixed rate of oscillations only during the power outage conditions so that said secondary time base signals are produced at a predetermined rate corresponding to a predetermined number of seconds time;

counter memory means energized by said second supply conductor means and receiving said secondary time base signals to accumulate the total count of said secondary time base signals occurring during the intervals of the power outages, and said counter memory means further having data output terminals connected to said data input/output terminals of said data memory means for adding the seconds time of the power outage intervals to the stored beginning time of the power outages.

12. A time registering electric energy meter as claimed in claim 11 wherein said standby battery source includes at least one lithium type primary battery connected to said voltage responsive switch means.

13. A time registering electric energy meter as claimed in claim 12 wherein said main DC supply means includes a transformer having a primary connected to the AC electric energy quantity to be measured and a secondary connected to a diode rectifier bridge producing first and second outputs, said first output providing an unregulated and unfiltered supply voltage, and further includes a voltage regulator means having an input connected to said second output of said rectifier bridge with a filtering capacitor being connected to said second output with said voltage regulator means having an output for providing a regulated and filtered supply voltage to both said first and second supply conductor means.

14. A time registering electric energy meter for measuring time related parameters of an AC electric energy quantity and maintaining time of day data registrations during power outages of the AC electric energy quantity, said meter comprising:

means producing variable and repetitive indications of incremental values of the AC electric energy quantity to be measured;

a main DC supply source energized by the AC electric energy quantity to be measured, said main DC supply including first and second supply conductors producing regulated DC supply voltage therefrom;

an auxiliary DC supply source including a standby primary battery and a voltage responsive switch means for connecting said battery to said first supply conductor for providing an uninterruptible and continuous supply of regulated DC supply voltage thereat;

power pulsing switch means connected between said standby primary battery and said first supply conductor and being operable between non-conductive and conductive switch states in response to first and second values applied to a control input thereof;

primary timer circuit means responsive to said AC electric energy quantity to be measured for producing first time base signals related to the frequency of said AC electric energy quantity;

secondary timer circuit means energized by said first supply conductor and including timing circuit means, and an output producing second time base signals having said first and second values and connected to said control input of said power pulsing switch means, said secondary timer circuit means further including a control input responsive to a first binary logic state to set said output at said first value for maintaining said power pulsing switch means at the non-conductive state, and further responsive to a second binary logic state to release said output to go to said second value at a predetermined time interval thereafter to render the conductive state of the switch;

data memory means energized by said first supply conductor and further including input/output data lines;

power outage detector means responsive to the AC electric energy energization of said main DC supply source to produce a first logic signal which goes between first and second binary logic states in response to the AC energization and the power outages;

metering sequence logic control circuit means energized by said second supply conductor and including real time data accumulations for registering time of day in seconds, minutes, hours and days of the week in response to said first time base signals, said time data accumulations being effective to establish time of usage parameters of said variable and repetitive indications, said logic control circuit means including input/output terminals connected to said data lines of said data memory means for storing said real time data accumulations in said data memory means, another of said input/output terminals receiving said first logic signal, and still another of said input/output terminals producing a second logic signal effective to apply said first and second binary state logic signals to said secondary timer circuit means in response to pulsed energization of said second supply conductor and the completion of a time update operation, such that upon deenergization of said second supply conductor by a power outage, reoccurring reenergization thereof is produced by said standby primary battery through said power pulsing switch means at the predetermined time intervals of said second time base signals for momentarily activating the logic control circuit means to update the real time accumulations in said data memory means and thereafter initiate a change in the binary logic state of said second logic signal so as to reset said secondary timer circuit means and deenergize said second supply conductor and to initiate another said predetermined time interval.

15. A time registering electric energy meter as claimed in claim 14 wherein said standby primary battery includes a lithium type primary battery.

16. A time registering electric energy meter as claimed in claim 14 wherein said main DC power supply source includes a transformer having a primary connected to the AC electric energy quantity to be measured and a secondary, and further includes a diode rectifier bridge connected to said secondary and having first and second outputs with said first output producing an unregulated DC supply voltage, still further includes a voltage regulator circuit means having an input connected to said second output of said diode rectifier bridge and still further having an output for supplying said first and second supply conductors.

17. A time registering electric energy meter as claimed in claim 14 including a third logic signal supplied by still another of said input/output terminals of said metering sequence logic control circuit wherein said third logic signal goes between first and second binary logic states in response to the logic control circuit receiving a change in the binary logic states of said first logic signal upon the occurrence of a power outage.

18. A time registering electric energy meter as claimed in claim 17 wherein said main DC supply source includes voltage regulator circuit means having an output with said output connected through a diode to said first supply conductor, and wherein said main DC supply source includes a transistor switch having an emitter to collector circuit connecting said output of said voltage regulator circuit means to said second supply conductor and further having a base input responsive to said third logic signal to render said transistor switch from a conductive to a nonconductive state to disconnect said output of said voltage regulator circuit means from said second supply conductor during a power outage.

19. A time registering electric energy meter as claimed in claim 18 wherein said second supply conductor is connected with said control input of said secondary timer circuit means so that said control input is responsive to both said second logic signal and the pulsed energization of said second supply conductor.

20. A time registering electric energy meter as claimed in claim 19 wherein said control input of said secondary timer circuit means is first released to initiate an initial second time base signal by the initial loss of supply at the second supply conductor at the beginning of a power outage and thereafter by the change in binary logic states of said second logic signal from the second to the first binary state following a change from the first to the second binary logic state that occurs first with the beginning of each pulsed energization of the logic control circuit.

21. A time registering electric energy meter as claimed in claim 20 wherein said timing circuit means of said secondary timer circuit includes a crystal controlled oscillator and divider circuit for producing said predetermined time interval in the second time base signals at a predetermined integral number of seconds.

22. A time registering electric energy meter as claimed in claim 21 wherein said predetermined time interval in said second time base signals is four seconds.

23. A time registering electric energy meter as claimed in claim 14 wherein said metering sequence logic control circuit means includes a microprocessor circuit means having a timer interrupt mode of operation and wherein a predetermined number of said primary time base signals are effective to initiate said timer interrupt mode of operation for effecting said real time data accumulations.

24. A time registering electric energy meter as claimed in claim 26 wherein said data memory means includes address input lines directly connected to preselected ones of said input/output terminals of said metering sequence logic control circuit means wherein said preselected ones of said input/output terminals include the ones connected to said data lines of said data memory means.

* * * * *